United States Patent [19]

Venczel et al.

[11] Patent Number: 4,766,847
[45] Date of Patent: Aug. 30, 1988

[54] APPARATUS AND SYSTEM FOR ANIMAL TRAINING

[76] Inventors: John Venczel, 32 Overlook Rd., Ossining, N.Y. 10562; Béla G. Liptak, 84 Old N. Stamford Rd., Stamford, Conn. 06905

[21] Appl. No.: 56,053

[22] Filed: Jun. 1, 1987

[51] Int. Cl.⁴ ............................................. A01K 15/00
[52] U.S. Cl. ....................................... 119/29; 340/573
[58] Field of Search .................. 119/29, 29.5, 96, 106; 340/564, 573, 561, 571, 685, 540; 455/9, 41, 100, 134

[56] References Cited

U.S. PATENT DOCUMENTS

| | | | |
|---|---|---|---|
| 3,589,337 | 6/1971 | Doss | 119/29 |
| 3,753,421 | 8/1973 | Peck | 119/29 |
| 3,777,712 | 12/1973 | Gardner et al. | 119/29 |
| 4,136,338 | 1/1979 | Antenore | 340/551 |
| 4,274,090 | 6/1981 | Cooper | 340/568 X |
| 4,481,428 | 11/1984 | Charlot, Jr. | 340/572 X |
| 4,634,975 | 1/1987 | Eccleston et al. | 340/572 X |

Primary Examiner—Robert P. Swiatek
Assistant Examiner—R. Thomas Price
Attorney, Agent, or Firm—E. Lieberstein

[57] ABSTRACT

Apparatus and system for training an animal to remain confined in a prescribed area defined by an electrical wire conductor through which A.C. current is passed. A receiver is used having two coils disposed at substantial right angles to each other and includes a control circuit for applying a high voltage to the animal in the form of an electrical shock when the signals induced in the coils are related to each other in a given proportion corresponding to a predetermined distance between the animal and the wire conductor.

7 Claims, 3 Drawing Sheets

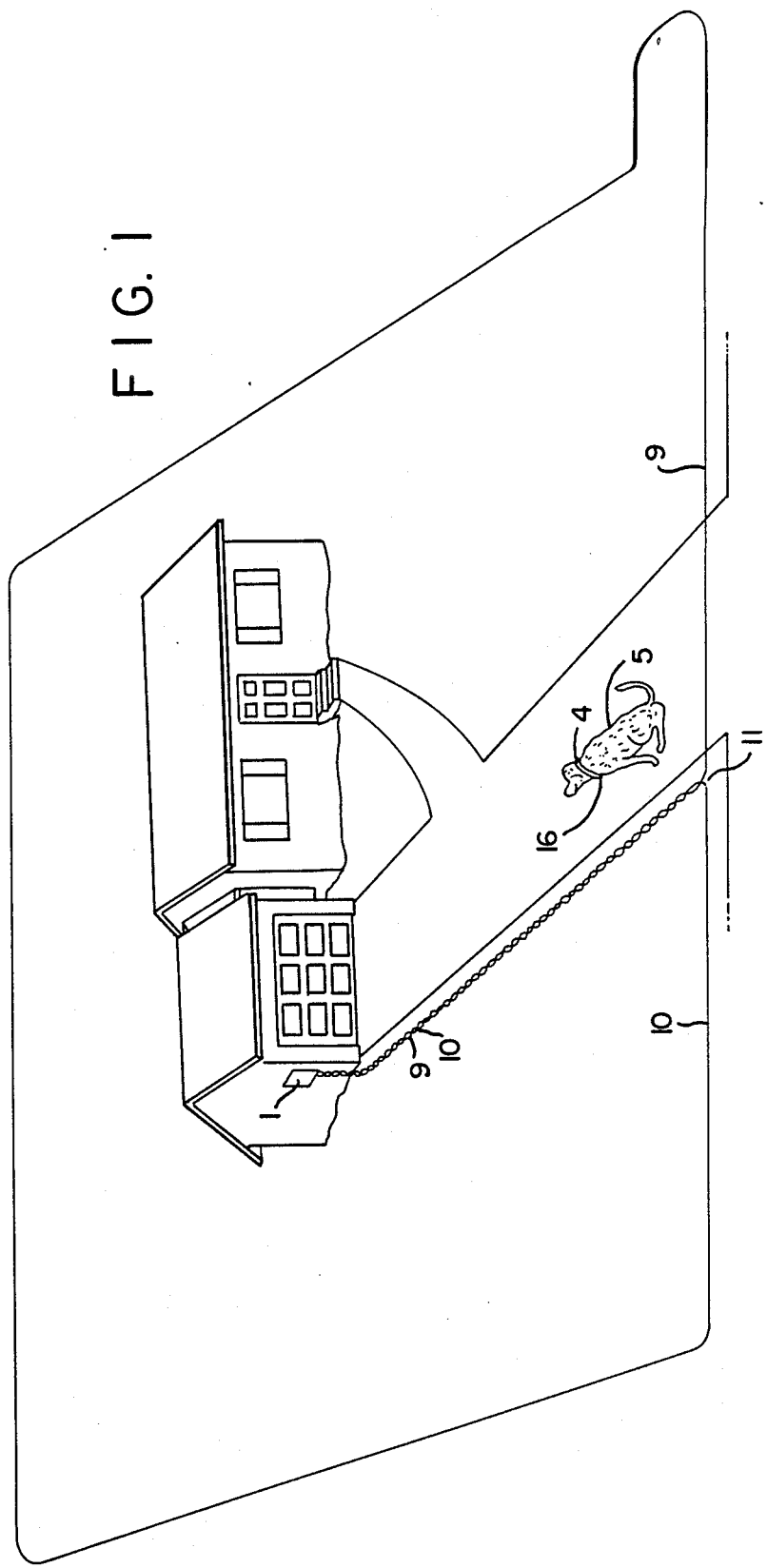

SIGNAL AMPLITUDES FROM THE VERTICLE(V) AND
HORIZONTAL (H) COILS

DISTANCE FROM WIRE (FEET)

APPARATUS AND SYSTEM FOR ANIMAL TRAINING

This invention relates to an electrical apparatus and system for training an animal to remain confined within a defined area without human interference.

BACKGROUND OF THE INVENTION

One known method for training an animal not to leave a prescribed area is to give the animal an electric shock as the animal approaches the boundary line defining the perimeter of the prescribed area. There are several known devices which apply an electric shock to train an animal. Some operate manually under the direct supervision of a trainer and others operate under radio control or in response to a particular behavior of the animal.

A system which operates to apply an electric shock to an animal based upon sensing the intensity of an electric field generated about a current carrying wire conductor surrounding the area in which the animal is to be confined is taught in U.S. Pat. No. 3,753,421. In accordance with the teaching in this patent, an electric antenna in the form of a wire is used to define the perimeter of the restricted area. AC current is passed through the wire to generate an electromagnetic field around the wire at sub-broadcast band frequency. A receiver is attached to the collar of the animal tuned to the frequency of this field. The receiver has an electric circuit which senses the intensity of the electromagnetic field and generates a high voltage when the detected signal strength exceeds a predetermined level corresponding to a desired fixed distance from the wire. The high voltage causes an electric shock.

The system described in the aforementioned patent suffers from a number of significant deficiencies which restrict its usefulness in terms of both its operation and practicality. One principal drawback of the system places a limitation on the geometry of the restricted area to basically that of a circle. The reason for this is due to how the system operates. The receiver circuit senses the level of field strength, i.e., the intensity of the field at the location of the receiver. Since the receiver is attached to the animal an electric shock will be generated each time the detected intensity is above a predetermined magnitude. Accordingly, the system is very sensitive to the magnitude of the electric current in the wire. If the area defined by the electrical wire is not circular but is rather of an irregular shape, the electromagnetic field intensity will not be uniform along the wire. As a result, the field strength will vary in magnitude particularly around sharp turns and corners or where the wire is looped close to itself. Since the receiver operates in response to field intensity, a variation in signal strength will vary the distance at which the receiver generates the electric shock. For a rectangular geometry, the electromagnetic field from the sides are additive thereby substantially doubling the signal strength near the corners. The field strength is thus shape dependent and for some irregular shapes the field may be caused to subtract near the wire conductor. Equally significant is the fact that the signal strength will also vary due to interference from any metal object lying in the vicinity of the wire. Moreover, since the magnitude of the electrical current in the wire controls the intensity of the field, the operator must also be careful to maintain the applied power to the wire at a constant level.

In addition, the system taught in the aforementioned patent operates to exponentially increase the generated voltage as the animal continues to approach the wire which exponentially increases the shock level. In practice, the animal almost momentarily receives a full power shock unless the animal is slowly walking toward the wire. A sudden application of a full shock operates as a severe punishment which bewilders the animal and leads to a confused state of behavior.

OBJECTS OF THE INVENTION

It is accordingly, the principal object of the present invention to provide a training apparatus and system for restricting the freedom of movement of an animal without human interference by the controlled application of an electric shock preferably in combination with a high pitched signal at a frequency audible to the animal.

It is a further object of the present invention to provide the electric shock in response to an electrical signal proportional to the position of the animal relative to the perimeter of the area in which the animal is to be confined with the electrical signal being substantially independent of the current intensity in the wire generating the electromagnetic field.

SUMMARY OF THE INVENTION

In accordance with the preferred embodiment of the present invention, the system operates to control the movement of an animal relative to an area defined by the location of an electrical conductor through which an AC current is passed by generating an electric shock from a receiver mounted upon the animal when the animal approaches the conductor with the receiver comprising first coil means for sensing the strength of the magnetic field generated about the electrical conductor along a first plane substantially parallel to the ground second coil means for sensing the strength of the magnetic field generated about the electrical conductor along a second plane vertically intersecting the first plane; control signal means for comparing the signal strength in said first and second coil means and means responsive to said control signal means for generating a high voltage when the signals received in said first and second coil are related to each other in a given proportion. Accordingly, the receiver operates independent of the absolute value of the current intensity in the electrical conductor and avoids all of the problems indicated above relative to sensing the field directly from the intensity of current in the wire.

In a second embodiment of the present invention the system operates to control the movement of an animal relative to an area defined by the location of an electrical conductor through which an AC current is passed with the system including means for generating an electric shock in response to a given position of the animal relative to the perimeter of the defined area and/or means for generating a high pitched sound audible to the animal as the animal approaches the electrical conductor.

DRAWINGS

Other objects and advantages of the present invention will become apparent from the following detailed description of the present invention when read in conjunction with the accompanying drawings of which:

FIG. 1 is a perspective view of a residential home bounded by a current carrying wire conductor which defines a controlled area for confining a dog by means of a receiver attached to the dog and responsive to a magnetic field generated about the current carrying wire conductor;

DETAILED DESCRIPTION OF THE INVENTION

Figure 3:
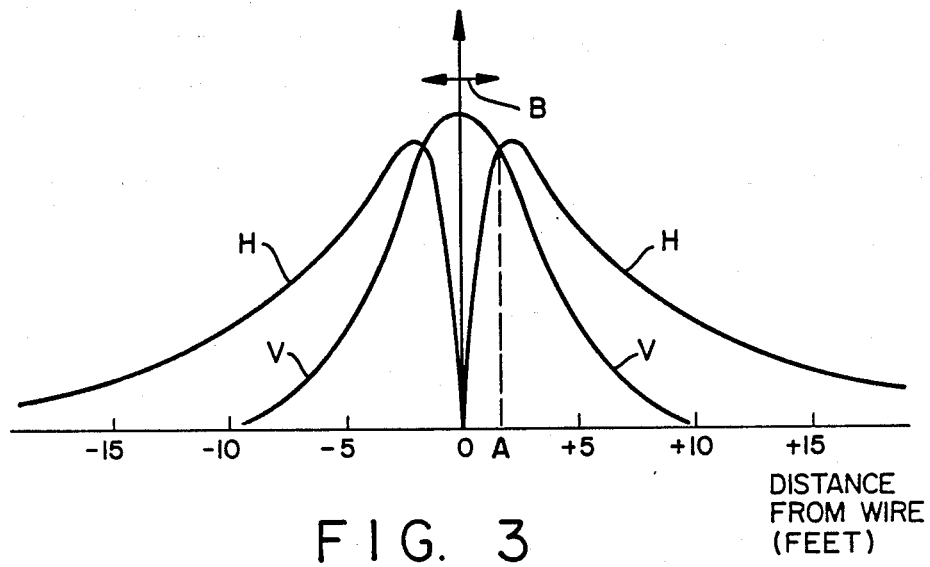
FIG. 3 is a graphical illustration of the relationship between the induced signals received in each coil in the receiver of FIG. 1 and the position of each coil relative to the position of the wire conductor.

To control the freedom of movement of an animal in accordance with the present invention, a receiver with means for generating a high pitched sound and/or a high voltage is mounted on the animal. The receiver operates to detect the position of the animal relative to the position of a current carrying conductor for activating the high pitched sound and/or the high voltage in a predetermined manner.

Referring now to FIG. 1 of the drawings in which a dog 5 is shown having a receiver 16 affixed to the dog 5 preferably by attaching it to the dog's collar 4 preferably below the neck of the dog 5. An AC power transmitter (not shown) may be located in any convenient indoor location such as the garage of a house 1. The transmitter is powered from a household AC outlet of, e.g., 115 volts AC. A current carrying wire conductor with two ends 9 and 10 is connected from the house transmitter with the ends 9 and 10 laid out around the house to form a closed loop of any desired shape or geometry in which the dog 5 is to be confined. The two ends 9 and 10 of the wire are preferably interwound in a twisted arrangement along the front walk of the house for the purpose of effectively cancelling out the magnetic field generated around each conductor 9 and 10 along the front walk area. At a desired boundary point 11 the two conductors 9 and 10 separate to encircle the house 1. The conductors 9 and 10 are laid above ground level or are buried beneath the surface to a shallow depth. The AC transmitter generates an AC current through each conductor 9 and 10 at a suitable transmitting frequency generally in the sub-broadcast range.

Figure 2:
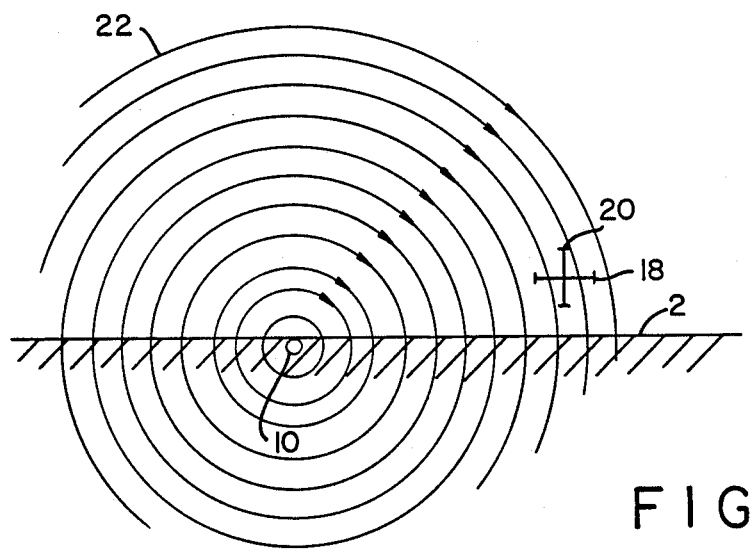
FIG. 2 is a diagrammatic view, in side elevation, illustrating the relationship of the magnetic field generated from the current carrying wire conductor of FIG. 1 and a pair of coil means in the receiver of FIG. 1 for detecting the position of the receiver relative to the wire conductor in accordance with the present invention.

The receiving device 16 is a miniature compact battery operated electronic device which senses the magnetic field generated by the current carrying wire conductors 9 and 10 in such a way as to be independent of the absolute value of the intensity of the current through either conductor. This is accomplished using two sensing coils 18 and 20 which are oriented transverse to each other. Sensing coil 18 is preferably aligned along a substantially horizontal plane parallel to ground level whereas sensing coil 20 is aligned substantially vertically. The position of the coils 18 and 20 shown in FIG. 2 at an arbitrary position of the dog 5 relative to the wire conductor 10. Since the receiver 16 is mounted on the collar of the dog 5 it is above ground at a level based on the height of the dog 5.

The wire conductor 10 generates an electromagnetic field 22 indicated by concentric circles which intersect the coils 18 and 20 and induce signals which vary in amplitude from one another based upon their respective orientation and their position relative to the wire conductor. A graphical display of the amplitude versus distance for each coil is shown in FIG. 3.

The magnitude of the signal induced in each coil 18 and 20 is proportional to the strength of the magnetic field at a given distance and to the amount of magnetic flux intersecting its cross section. At a fixed distance the signal is maximum when the magnetic field is perpendicular to its cross section and zero when it is tangential. In the position shown in FIG. 2, the horizontal coil 18 picks up a larger signal than the vertical coil 20. When the two coils 18 and 20 are exactly above the wire 10, the induced signal V in the vertical coil 20 as indicated in FIG. 3 is at maximum while the induced signal H in the horizontal coil 18 is zero. The signal H induced in the horizontal coil 18 is zero. The signal H induced in the horizontal coil 18 increases slowly and gradually as the receiver 16 is brought closer to the wire 10 and then, abruptly, drops to zero when the coil 18 is exactly above the wire. Conversely, the signal V induced in the vertical coil 20 will not be detectable until the device is brought relatively close to the wire 10 and then it will increase steeply, reaching its maximum value when the receiver 16 is exactly above the wire 10. Although the amplitude of each signal received by the coils 18 and 20 is proportional to the intensity of the current in the wire, their relative relationship, such as their ratio, will be independent of the current intensity in the wire. For instance, the point where the two curves intersect will always be at point A. At this point, the horizontal and vertical distance from the receiver 16 to the wire 10 are equal. At this location, each coil 18 and 20 in the receiver 16 makes an included angle with the wire 10 of 45 degrees.

The signals received by the coils 18 and 20 may be used in a variety of ways to generate a high pitched sound and to control the application of an electric shock to the animal 12 independent of the absolute value of the current intensity in the wire 10. Preferably, the electric shock should be applied within region B of FIG. 3 which can be varied by changing the proportion between the signals induced in coils 18 and 20. Once again, this is independent of the current intensity in the wire 10. The relationship between the signals induced in coils 18 and 20 determines when the electric shock is delivered corresponding to a desired location from the wire 10.

Figure 4:
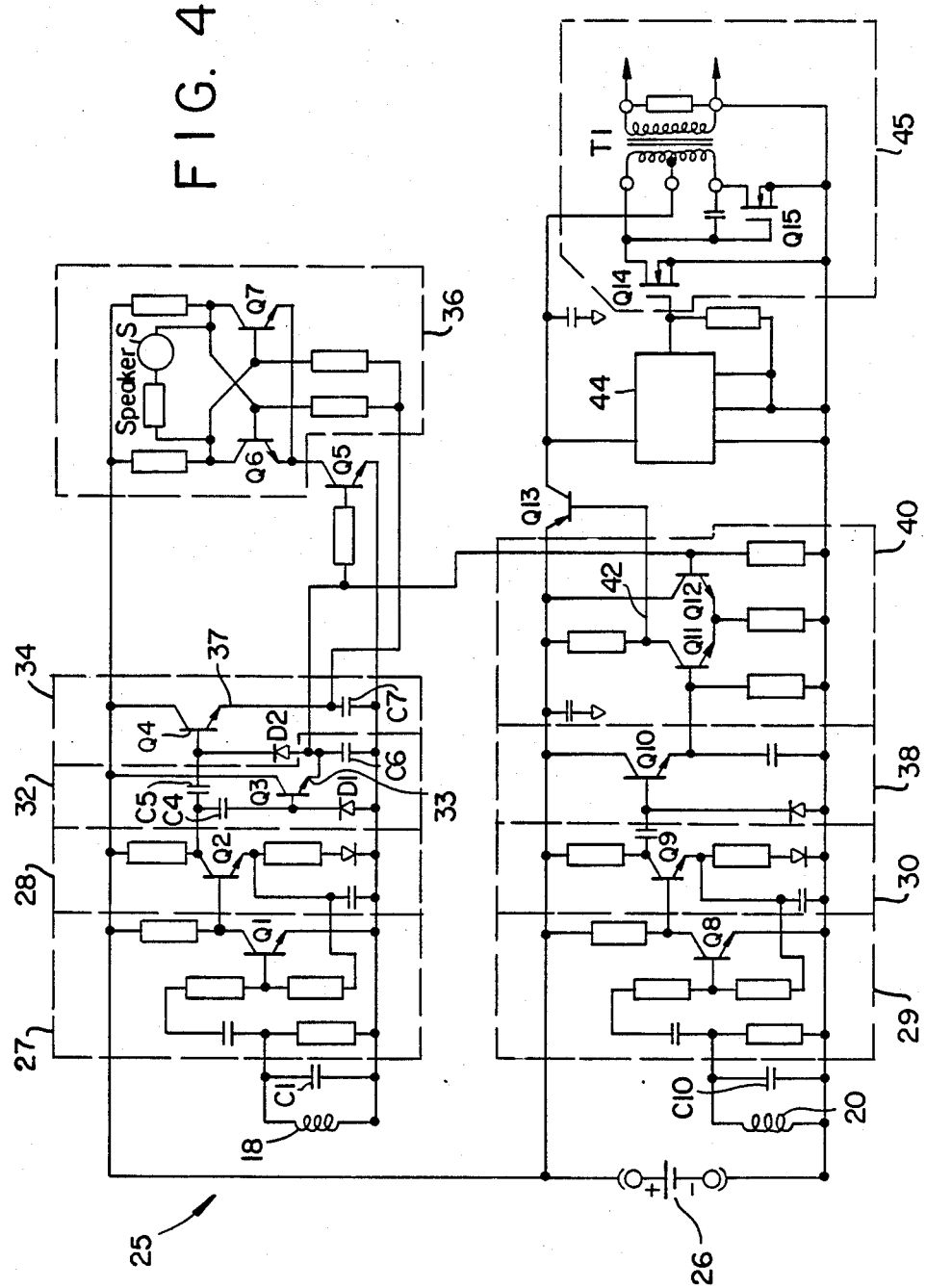
FIG. 4 is an electrical circuit diagram of the receiver of FIG. 1.

The coils 18 and 20 are in an electrical circuit 25 mounted in the receiver 16 for generating the electric shock. The schematic diagram for the electric circuit 25 is shown in FIG. 4. The circuit 25 is powered by a 6-volt miniature battery 26.

The magnetic field generated about the wire conductor 10 is sensed simultaneously by the horizontal coil 18 and the vertical coil 20 respectively. The coils 18 and 20 are tuned to respond to a desired frequency by capacitors C-1 and C-10. The induced signal in coil 18 is amplified in amplifier circuits 27 and 28 containing transistors Q-1 and Q-2 and the induced signal in coil 20 is amplified in amplifier circuits 29 and 30, containing transistors Q-8 and Q-9. The amplifiers 29 and 30 for coil 20 are substantially identical to amplifiers 27 and 28 for coil 18. A voltage doubler circuit 32 is formed by transistor Q-3 diode D-1 and capacitors C-4 and C-6.

A second voltage doubler 34 is formed by transistor Q-4 with diode D-2 and capacitors C-5 and C-7. The output of the first voltage doubler 32 at the emitter 33 of transistor Q-3 drives transistor Q-5. Transistor Q-5 operates as a power switch for turning "on" or "off" a voltage to frequency converter 36. The voltage to frequency converter 36 is a conventional circuit which includes transistors Q-6 and Q-7. A speaker S is disposed between the collectors of transistors Q-6 and Q-7 for generating an audible sound of high pitch which varies in frequency in proportion to the control voltage at the emitter output 37 of voltage doubler 34. When the voltage to frequency converter is turned on the control voltage is about 1.5 volts and the frequency of oscillation is about 1 $KH_z$. As the animal approaches wire 10 the control voltage increases and so does the frequency of oscillation causing the emission of a higher pitched sound from the speaker. The frequency increases up to 3 $KH_z$ providing about one and a half octave variation from minimum to maximum.

The horizontal coil 18 was selected to control the output of the variable frequency converter 36 because of its more linear output. Alternatively, the vertical coil 20 may have been used which would have provided a continually increasing audible output right to the location directly above the wire conductor 10.

The induced signal in the vertical coil 20 is amplified by amplifier circuit 29 and 30 and doubled through a voltage doubler circuit 38. The output of the voltage doubler circuit 38 is fed as one input to a comparator circuit 40. The output of the voltage doubler circuit 32 is fed as a second input to the comparator circuit 40. The comparator circuit 40 includes transistors Q-11 and Q-12 to provide an output 42 which is proportional to the difference between its input signals. Accordingly, when the vertical signal becomes larger than the horizontal signal transistor Q-13 is turned on which, in turn, turns on a square wave generator 44, such as integrated circuit ICM 7555, which operates at about 1 $KH_z$. The output of the square wave generator 44 drives a high voltage inverter 45 for generating an electric shock. The high voltage inverter 45 includes two field effect transistors Q-14 and Q-15 and a transformer T-1. The secondary coil of the transformer T-1 applies the electric shock. The electric shock is applied at a fixed voltage which will not harm the animal or bewilder the animal.

If the animal passes over the wire conductor, the electric shock will decrease as the animal moves further away from the controlled perimeter. This can happen if the animal runs through at high speed. The animal may eventually learn to do this which can minimize the physiological effect of the control system of the present invention. This may readily be overcome in accordance with the present invention by timing the application of the electric shock, i.e., once the electric shock is initiated, a timer circuit (not shown) is triggered to cause the electric shock to continue to be applied for a fixed duration of time such as two or three seconds independent of further movement of the animal. The timer circuit (not shown) may be a conventional solid state timer, the output of which keeps transister Q-13 turned on until it times out.

What is claimed is:

1. Apparatus for training an animal to remain confined to a predetermined area defined by the location of an electrical conductor through which an AC current is passed comprising a receiver having a first and second coil tuned to the magnetic field generated around the conductor with each coil substantially disposed at right angles to each other, control signal means for comparing the signal strength in said first and second coil and means responsive to said control signal means for generating a high voltage and applying said voltage as an electrical shock to said animal when the signals induced in said first and second coil are related to each other in a given proportion corresponding to a predetermined distance between the animal and the electrical conductor.

2. Apparatus as defined in claim 1 wherein said electrical conductor is an electrical wire and wherein said receiver is affixed to said animal.

3. Apparatus as defined in claim 2 wherein said electrical conductor is laid out in a closed loop in series circuit with a source of AC power for passing AC current through the conductor and for generating said magnetic field with said closed loop forming a predetermined geometry defining said predetermined area.

4. Apparatus as defined in claim 3 wherein said control signal means comprises amplifier means coupled to each coil and a comparator circuit for comparing the amplified signal generated from each coil.

5. Apparatus as defined in claim 4 wherein said means for generating a high voltage comprises a square wave generator, a high voltage inverter and a transformer.

6. Apparatus as defined in claim 4 wherein said electrical conductor is laid out around a house with the conductor interwound along the front walk of the house.

7. A system for restricting the movement of an animal to within a defined area comprising: means for generating a magnetic field about the perimeter of the area in which the animal is to be confined, means for sensing the magnetic field strength at a given location relative to said perimeter; means responsive to said magnetic field at said location for generating a high pitched sound audible to said animal and means for increasing the pitch of said sound as the animal moves closer to said perimeter, comprising means affixed to said animal for generating an electric shock at or close to said perimeter, wherein said means for sensing the magnetic field strength comprises a pair of coils disposed substantially transverse to each other and control signal means for comparing the signal strength induced in each coil.

* * * * *